United States Patent [19]

Manning

[11] 4,407,440
[45] Oct. 4, 1983

[54] SEMICONDUCTOR DIE BONDING MACHINE

[75] Inventor: John J. Manning, San Jose, Calif.

[73] Assignee: Mesa Technology, Mountain View, Calif.

[21] Appl. No.: 236,994

[22] Filed: Feb. 23, 1981

[51] Int. Cl.³ .............................................. B23K 1/12
[52] U.S. Cl. .................................................. 228/6 A
[58] Field of Search ............... 228/6 A, 56.5, 44.1 A; 29/740, 741, 840, 843, 860, 589

[56] References Cited

U.S. PATENT DOCUMENTS 2,990,732 7/1961 Ide ........................................... 408/79
3,781,978 1/1974 Intrator et al. ......................... 29/589
3,949,925 4/1976 Keizer et al. ...................... 228/180 A
4,079,509 3/1978 Jackson et al. .................. 228/180 A Primary Examiner—Nicholas P. Godici
Assistant Examiner—M. Jordan
Attorney, Agent, or Firm—Fliesler, Dubb, Meyer & Lovejoy

[57] ABSTRACT

A semiconductor die bonding machine for the electrical connection of the contact pads of a semiconductor die with the leads of a die holding device, such as a printed circuit board or main leadframe. The bonding machine utilizes micro leadframes formed in an aluminum foil tape and has an alignment mechanism which permits the rapid, mechanized bonding of the contact pads to the leads of the die holding device.

9 Claims, 8 Drawing Figures

U.S. Patent  Oct. 4, 1983  Sheet 1 of 3  4,407,440
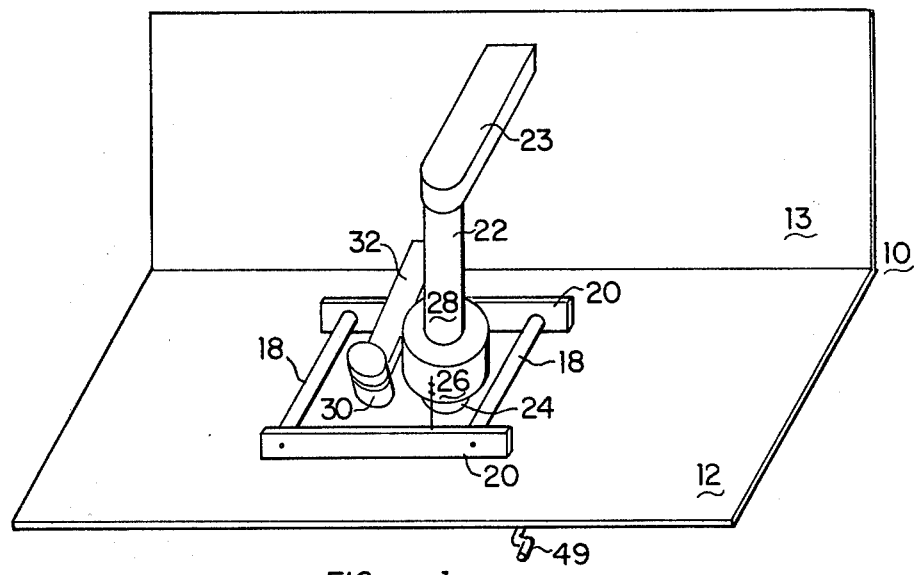
FIG.__1
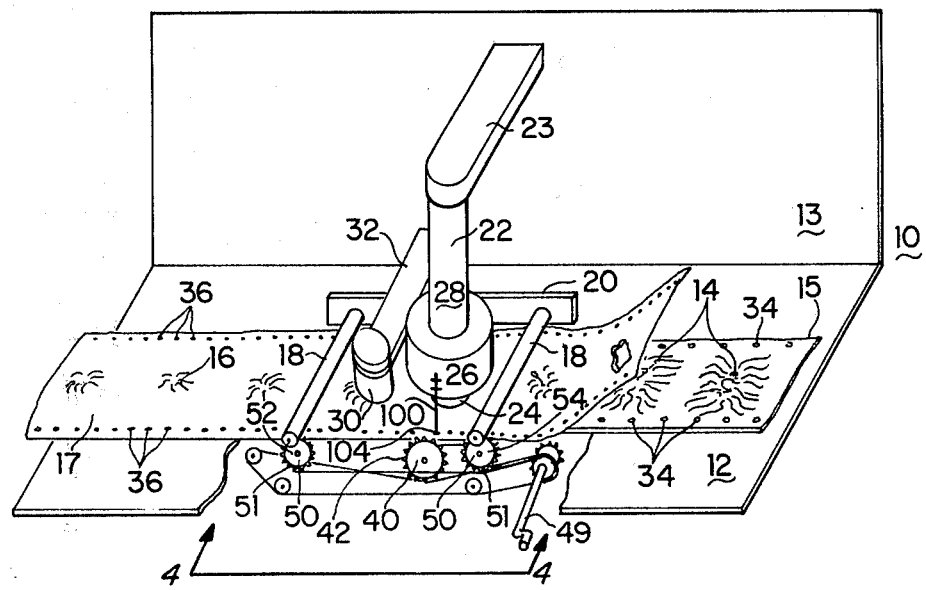
FIG.__2

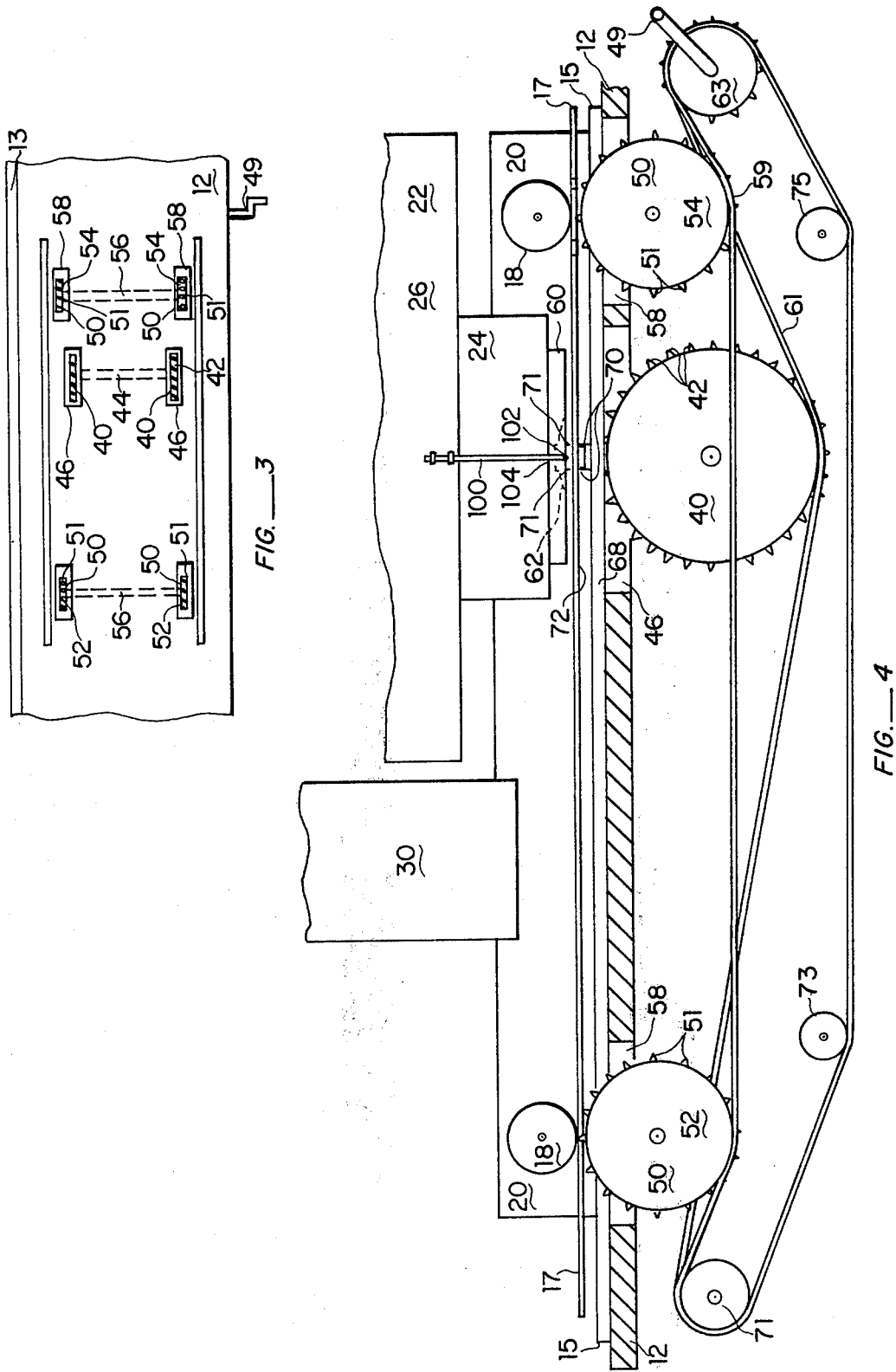
FIG.___3
FIG.___4

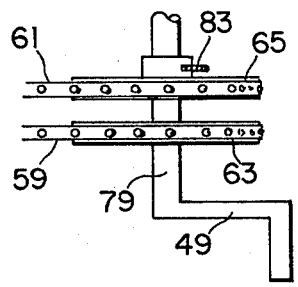
FIG._5
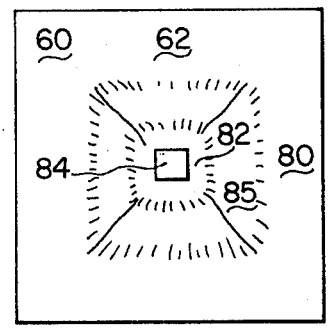
FIG._6
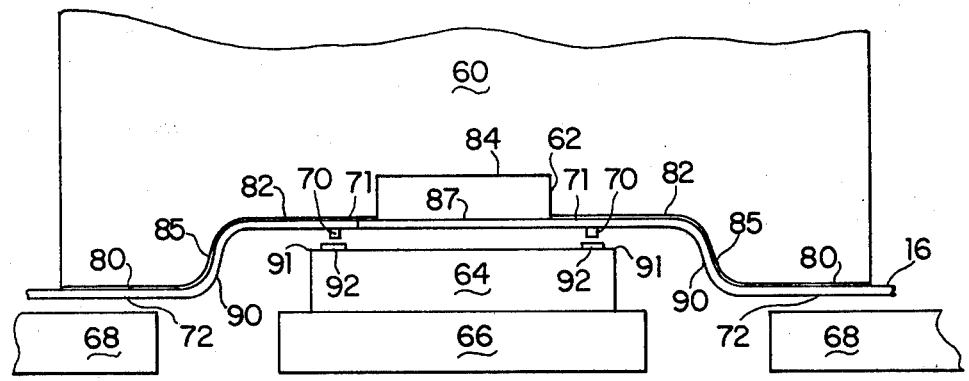
FIG._7
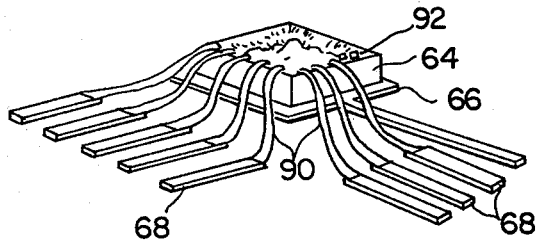
FIG._8

SEMICONDUCTOR DIE BONDING MACHINE

CROSS REFERENCE TO RELATED APPLICATIONS

The subject matter of the present application is related to a previously filed application entitled "Semiconductor Die Bonding Machine," Ser. No. 202,258, filed Oct. 30, 1980. It is also related to a previously filed application entitled "Aluminum Micro Leadframe and a Process and a Machine for the Manufacture Thereof," Ser. No. 202,247, filed Oct. 30, 1980, and it is related to an application entitled "Improved Aluminum Micro Leadframe and a Process and a Machine for the Manufacture Thereof," filed on the same date as the instant application.

BACKGROUND OF THE INVENTION

1. Field of the Invention

The present invention relates generally to semiconductor die bonding machines and more particularly to a bonding machine which will align and electrically connect a micro leadframe to a semiconductor die and main leadframe in a single operation.

2. Description of the Prior Art

A semiconductor die may be electrically connected to a main leadframe by utilizing a micro leadframe having a plurality of leads, each of which is bonded on its inner end to a contact pad of the semiconductor die and bonded on its outer end to an individual lead of the main leadframe. The problem encountered in bonding machines utilizing leadframes has been the difficulty involved in the alignment of the micro leadframe leads with the contact pads of the semiconductor die and the leads of the main leadframe. Bonding machines such as that described in patent application Ser. No. 202,258, referenced hereinabove, utilize complicated optical systems to achieve alignment of each individual micro leadframe with the semiconductor die contact pads and the main leadframe leads. The instant invention, through its use of alignment holes, achieves the mechanized alignment of the micro leadframes.

Another problem associated with micro leadframe bonding has been the lack of a strong platform to which the semiconductor die may be affixed for grounding and heat sinking and which adds strength to the die connections. Prior bonding machines, such as that described in patent application Ser. No. 202,258, referenced hereinabove, could not affix the semiconductor die to the main leadframe platform because the platform interfered with alignment and electrical connection. The instant invention is able to utilize the main leadframe platform, thereby providing a grounded heat sink for the semiconductor die and achieving a more rugged bonded configuration.

There is therefore an unfilled need in the industry for a bonding machine in which the alignment of the semiconductor die contact pads, the leads of the micro leadframe and the main leadframe leads can be easily and mechanically accomplished. The instant invention performs such a bonding operation utilizing a specially designed micro leadframe; such a micro leadframe and a process and machine for the manufacture thereof is described in the patent application entitled "Improved Aluminum Micro Leadframe and a Process and a Machine for the Manufacture Thereof," filed on the same date as the instant application and referenced hereinabove.

SUMMARY OF THE PRESENT INVENTION

It is therefore a primary objective of the present invention to provide a semiconductor die bonding machine which can align and electrically connect a micro leadframe to a semiconductor die and a main leadframe in a single operation.

It is another object of the present invention to provide a semiconductor die bonding machine which allows the semiconductor die to be affixed to the center platform of a main leadframe for grounding, heat dissipation and ruggedness.

The semiconductor die bonding machine of the present invention includes a heated bonding surface against which the various bonds will be made. A specially designed aluminum foil containing a series of micro leadframes is utilized; each micro leadframe having a plurality of leads each of which is configured to be precisely alignable between a contact pad of a semiconductor die and a lead of a main leadframe. The aluminum foil is formed with a plurality of sprocket holes located along the lateral edges of the foil.

Utilizing standard techniques, a semiconductor die is initially centrally affixed (relative to the main leadframe leads) to the center platform of a main leadframe with its contact pads directed upwards. Both the main leadframe strip and aluminum foil are engaged with sprocket wheels which are provided in the instant device and which have teeth that engage the sprocket holes in the aluminum foil and the leadframe strip. The leadframe strip and aluminum foil are mechanically moved through the device by the simultaneous rotation of the sprocket wheels. After the leadframe strip and aluminum foil are mounted in the device on the sprocket wheels, a micro leadframe on the aluminum foil is aligned such that the inner end of each lead of the micro leadframe coincides with a contact pad of the semiconductor die, and the outer end of each lead of the micro leadframe coincides with a main leadframe lead. Alignment of the main leadframe leads, the micro leadframe leads and the contact pads is verified utilizing an optical instrument such as a binocular microscope. After alignment is achieved, pressurized contact is created between the semiconductor die contact pads and the inner ends of the micro leadframe leads against the bonding surface. In the same operation, pressurized contact is made between the outer ends of the micro leadframe leads and the main leadframe leads against the bonding surface. The single pressurized contact operation results in the thermo compression bonding of all inner leads and all outer leads. The sprocket wheels are then rotated such that a following main leadframe with an aligned micro leadframe is positioned under the thermo compression bonder and a thermo compression bond is made therebetween. In this manner, a series of micro leadframes are bonded to main leadframes having semiconductor die mounted thereon. Thereafter, the aluminum foil surrounding the micro leadframes is removed, leaving the leads of the micro leadframes in a bonded configuration such that the semiconductor die are electrically connected to the main leadframes.

An advantage of the present invention is that the bonding of a semiconductor die to a main leadframe is quickly, easily and inexpensively accomplished in a single bonding operation.

Another advantage of the present invention is that it permits easier alignment of the micro leadframes over prior devices.

A further advantage of the present invention is that the semiconductor die is affixed to the central platform of a main leadframe, thus providing a grounded heat sink for the die and greater ruggedness to the system.

These and other objects and advantages of the present invention will no doubt become apparent to those of ordinary skill in the art after having read the following detailed description of the preferred embodiments which are illustrated in the several figures of the drawing.

IN THE DRAWING

FIG. 1 is a perspective view of the semiconductor die bonding machine of the present invention;

FIG. 2 is a perspective view of the semiconductor die bonding machine depicted in FIG. 1, wherein the semiconductor die bonding operation is depicted and a cutaway section showing the sprocket wheel alignment mechanism is provided;

FIG. 3 is a top plan view of the work surface of the instant invention;

FIG. 4 is a side elevational view of the bonding area of the present invention taken along lines 4—4 of FIG. 2;

FIG. 5 is a top plan view of the drive handle mechanism of the present invention;

FIG. 6 is a plan view of the bonding head of the present invention;

FIG. 7 is a side cross sectional view of the electrical connection of a semiconductor die to a main leadframe utilizing the present invention; and FIG. 8 is a perspective view illustrating the bonded configuration of a semiconductor die to a main leadframe through utilization of the instant invention.

DESCRIPTION OF THE PREFERRED EMBODIMENT

As depicted in FIGS. 1 and 2 the preferred embodiment of the improved semiconductor die bonding machine 10 of the present invention includes a horizontally disposed work surface 12 and a back plate 13 which rises vertically from the rear of work surface 12. A semiconductor die holding device 14, or a series of such die holding devices, are arranged to move laterally across the work surface 12. In the preferred embodiment, a main leadframe 14 formed in a continuous strip 15 is utilized as a die holding device. Each main leadframe 14 has a semiconductor die affixed thereto, as is more fully described hereinbelow.

It is to be realized that a die holding device could include a printed circuit board having a suitable configuration of leads to which a semiconductor die could be directly bonded. Such a printed circuit board would have a semiconductor die centrally bonded thereto such that the contact pads of the semiconductor die are in proper alignment with the leads on the printed circuit board. The printed circuit board, with its affixed semiconductor die, would then be utilized in the instant device in the same manner as are the main leadframes 14 described in greater detail hereinbelow. Thus the bonding of the contact pads of the semiconductor die to the leads of the printed circuit board may be accomplished by the instant device.

Aluminum micro leadframes 16, preferrably formed serially in a continuous aluminum foil tape 17, are placed above the main leadframes 14 and are arranged to move laterally with the main leadframes across the work surface 12. Hold down rollers 18 play lightly on top of the aluminum foil 17, and are held in place by brackets 20 which are affixed to work surface 12.

A downwardly movable thermo compression bonder 22 is suspended above the aluminum tape 17 by means of an arm 23 which emanates from the back plate 13. The thermo compression bonder 22 has a bonding head 24 disposed at its lower most end, proximate the aluminum tape 17. The bonding head 24 is heated by a bonding head heater 26 which is affixed to the main shaft 28 of the thermo compression bonder 22. A standard hydraulic or mechanical system (not shown) is utilized to activate the bonder 22 in a downward direction.

An optical alignment system 30 is suspended over work surface 12 through the use of an arm 32 which emanates from back plate 13. The optical alignment system 30 is utilized to align the micro leadframes with the main leadframes and semiconductor die contact pads prior to the bonding thereof. The optical alignment system 30 may take the form of a binocular microscope, image enlarging closed circuit television (CCT), photo diode or other optical systems.

As is depicted in FIG. 2, the main leadframe strip 15 contains a series of holes 34 formed in the outer lateral edges thereof. Additionally, the aluminum foil tape 17 also contains a series of holes 36 formed in its lateral edges.

As depicted in FIG. 2, a first set of sprocket wheels 40, having sprocket teeth 42 radially projecting therefrom, is utilized to move the main leadframes 14 laterally across the work surface 12, through the interaction of the sprocket teeth 42 thereof with the holes 34 in the main leadframe strip 15. As depicted in FIG. 3, two identical sprocket wheels 40 are joined together by an axle 44, such that both wheels 40 will rotate at an identical speed. A slit 46 is formed in the work surface 12 such that the sprocket teeth 42 of each wheel 40 will protrude above the work surface 12 to engage the holes 34 formed in the main leadframe strip 15. A simple bearing mechanism, not shown, is joined to the bottom surface of the work surface 12 and is utilized to support the axle 44 in position beneath the work surface 12.

Another group of sprocket wheels 50 having sprocket teeth 51 radially projecting therefrom, is utilized to move the aluminum foil tape 17 laterally across the work surface 12, through the interaction of the sprocket teeth 51 thereof with the holes 36 formed in the aluminum tape 17. The group of sprocket wheels 50 is divided into two sets of sprocket wheels 52 and 54 in the preferred embodiment. One set of sprocket wheels 52 is located to engage the aluminum tape 17 prior to its passage beneath the bonding head 24, and another set of sprocket wheels 54 is located to engage the aluminum tape after it passes beneath the bonding head 24. The utilization of two sets of sprocket wheels 52 and 54 serves to keep the aluminum tape aligned during the bonding operation.

As depicted in FIG. 3, each set 52 and 54 of sprocket wheels has an axle 56 which joins two identical sprocket wheels 50 together such that each of the joined sprocket wheels 50 will rotate at the same speed. A slit 58 is formed in work surface 12 to permit the sprocket wheels 50 to extend above the work surface 12 to engage the holes 36 of the aluminum tape 17. Additionally, due to the presence of the main leadframe strip 15 in engagement with its sprocket wheels 40, the sprocket wheels 50 are placed outside of the lateral edges of the main leadframe strip 15 such that the sprocket teeth 51 of wheels 50 will extend above the main leadframe strip 15 to engage the holes 36 in the aluminum foil 17. Thus, the aluminum foil 17 is greater in width than the main leadframe strip 15 such that the lateral edges of the aluminum foil 17 containing the sprocket holes 36, will be exposed for engagement with the teeth 51 of sprocket wheels 50. The purpose of the hold down rollers 18 is now seen to be that of holding down the aluminum foil 17 such that the sprocket holes 36 will properly engage the sprocket teeth 51 for accurate movement of the aluminum foil tape. No hold down mechanism is necessary to hold the main leadframe strip 15 in engagement with the sprocket wheels 40 due to the weight and rigidity of the main leadframe strip 15. A drive handle 49 is utilized by the operator to rotate the sprocket wheels 40, 52 and 54 through a linkage hereinafter described.

FIG. 4 is a cross sectional view of the bonding area of the present invention taken along lines 4—4 of FIG. 2. As depicted therein, sprocket wheels 52 and 54 protrude through slits 58 in work surface 12 to engage the aluminum foil 17. Sprocket wheel 40 protrudes through slit 46 in work surface 12 to engage the leadframe strip 15. Hold down rollers 18 serve to hold the aluminum tape 17 in engagement with the sprocket wheels 52 and 54. Many mechanisms could be developed to rotate the sprocket wheels 40, 52 and 54 such that the main leadframe strip 15 and aluminum foil 17 are caused to move. In the preferred embodiment, alignment of the micro leadframes 16 and main leadframes 14 is maintained by causing both the aluminum foil 17 and main leadframe strip 15 to move at the same speed.

As depicted in FIGS. 4 and 5, two sprocket teeth engaging belts 59 and 61 are driven by two sprocketed driving wheels 63 and 65 having identical circumferences, such that both belts 59 and 61 are driven at exactly the same speed. The two driving wheels are mounted on a single axle 79 to insure their identical rotation. Drive wheels 61 is adjustably mounted on axle 79 utilizing a tightening screw 83 for alignment of the main leadframe and micro leadframe as is hereinafter described. The axle 79 is mounted to the bottom side of the work surface 12 in a conventional manner (not shown).

One of the sprocket belts 59 engages the sprockets of the sprocket wheels 52 and 54 and the other belt 61 engages the sprocket teeth of wheel 40. Because the two belts 59 and 61 move at an identical speed, by virtue of their being driven by identically circumferenced driving wheels 63 and 65, the sprocket wheels 52, 54 and 40 will drive the aluminum tape 17 and leadframe strip 15 at identical speeds. A series of sprocket belt wheels 71, 73 and 75 are connected to the working surface 12 in a conventional manner, not shown, to create a taut path for the sprocket belts 59 and 61.

A bonding plate 60 having a carved bonding surface 62 is engaged to the bonding head 24. The bonding head 24 holds the bonding plate 60 in place in a detachable manner, such that a bonding plate 60 having a differently shaped bonding surface 62 may be interchanged by the operator, when differently shaped semiconductor die or main leadframes are utilized.

FIG. 4 depicts a configuration of the instant invention just prior to the formation of a thermo compression bond. A semiconductor die 64 is shown affixed to a center platform 66 of a main leadframe 14 such that the contact pads of the semiconductor die 64 face upwards. The semiconductor die has previously been accurately centered relative to the individual leads 68 of the main leadframe 14 by standard procedures which are not a part of the instant invention. A micro leadframe 16 is depicted in bonding position immediately above the main leadframe 14 such that the bonding bumps 70 formed on the inner ends 71 of each lead of the micro leadframe 16 are positioned directly above the contact pads of the semiconductor die 64. The outer ends 72 of the micro leadframe leads are positioned directly above the leads 68 of the main leadframe 14. It is to be appreciated that on the downward movement of the thermo compression bonder 22, that the bonding surface 62 will press the micro leadframe 16 downward. The cutout nature of the bonding surface 62 is such that the outer ends 72 of the micro leadframe leads will be pressed into contact with the leads 68 of the main leadframe 14 at the same instant that the bonding bumps 70 are pressed into contact with the contact pads of the semiconductor die 64. Thus, it is seen that in a single lowering of the thermo compression bonder 22 all bonds are simultaneously formed and the semiconductor die is fully electrically connected to the main leadframe leads.

An alignment pointer 100 is affixed to the thermo compression bonder 22 in a vertical orientation such that its lower end 102 is suspended above the sprocket holes 36 formed in the aluminum tape 17. The pointer 100 is positioned in lateral alignment with the middle of the bonding surface 62 and is utilized to determine when the micro leadframes are properly aligned with the bonding surface 62, as is more fully described hereinafter.

FIG. 6 depicts a bottom plan view of the bonding surface 62 of the bonding plate 60. The bonding surface 62 is shaped to match the particular semiconductor die and main leadframe configurations which are being bonded. Most such configurations are rectangular or square in nature, and the bonding surface depicted is square owing to the depiction of a square semiconductor die. A bonding plate 60 composed of berillium or boron nitride has proven to be suitable for thermo compression bonding of aluminum micro leadframes.

The bonding surface 62 is shaped to have an outer flat bonding area 80 which forms the outer bonds of the micro leadframe leads with the main leadframe leads. An inner flat bonding area 82 is formed to make the inner bonds of the inner ends 71 of the micro leadframe leads with the contact pads of the semiconductor die. To prevent possible damage of the circuitry on the semiconductor die, which might be caused by contact by the bonding surface 62, the innermost portion 84 of the bonding surface is further recessed to eliminate any possibility of unwanted contact. An "S" shaped curved portion 85 of the bonding surface 62 is formed between the outer 80 and inner 82 bonding areas. This curved portion 85 serves to shape the leads of the micro leadframe in bonding, as is further described herein.

FIG. 7 depicts the present invention at the instant prior to bonding. As depicted therein, the leads 90 of the micro leadframe 16 have been shaped by contact with the curved portion 85 of the bonding face 62 such that the outer flat portion 80 of bonding face 62 is about to press the outer end 72 of the micro leadframe leads 90 into contact with the lead 68 of the main leadframe, while at the same instant the inner bonding surface 82 is about to press the bonding bump 70 on the inner end 71 of the micro leadframe lead 90 into contact with the contact pads 92 of the semiconductor die 64. It is to be realized that a significant feature of the bonding surface 62 is that the curved portion 85 creates a uniform and very predictable shape for the connecting micro leadframe leads 90. This uniformity permits accurate prediction of the capacitance and inductance generated by the micro leadframe leads and thus permits the design of semiconductor dies which account for the impedance of the micro leadframes which will later connect the die to a main leadframe. Additionally, the "S" shape of the leads 90 of the micro leadframes aids in preventing a lead 90 from touching the upper edge 91 of the die 64.

It is to be realized that the inner ends 71 of the micro leadframe leads 90 are joined together by a small, square, aluminum holding element 87. This element is centrally located in each micro leadframe to maintain the inner ends 71 of the micro leadframe 16 in proper alignment for bonding. After bonding of the micro leadframe to the semiconductor die and main leadframe, this aluminum element 87 must be removed from the micro leadframe. Its removal is described hereinafter.

FIG. 8 depcits a semiconductor die after it has been electrically connected to a main leadframe utilizing the instant invention.

As depicted therein, each micro leadframe lead 90 can be seen to have an "S" shaped curve which was formed by the "S" shape 85 of the bonding surface 62. It is to be appreciated that the aluminum foil tape which held the leads 90 of the micro leadframe 16 has been pulled away from the main leadframe 14. The thermo compression bonds between the leads 90 of the micro leadframe and the main leadframe leads 68 as well as the bonds joining the micro leadframe leads 90 with the contact pads 92 of the semiconductor die must be strong enough to survive the pulling away, by a vacuum device, of the remainder of the aluminum foil 17 from the main leadframe 14 after bonding. This has proved to be no problem where aluminum foil tape of approximately 1-5 mils thickness is utilized.

The operation of the device can now be described. Initially, the bonding head heater is turned on such that the bonding head will achieve a temperature of approximately 450° C. A main leadframe strip 15 is placed on the working surface 12 and positioned such that the alignment holes 34 are engaged with the sprocket teeth 42 in sprocket wheel 40. It is to be noted that prior to the placement of the main leadframe strip 15 upon the work surface 12, a semiconductor die 64 has been affixed to the central platform 66 of each main leadframe 14, such that the semiconductor die 64 is centrally located relative to the leads 68 of the main leadframe 14 and aligned such that contact pad number 1 on the semiconductor die faces main leadframe lead number 1. Thus, each of the main leadframes 14 on the leadframe strip 15 already have semiconductor die 64 aligned and die bonded thereto when they are placed within the instant device. Devices for the accurate alignment and bonding of semiconductor die on main leadframe platforms are well known in the industry.

After having engaged the sprocket holes 34 of the main leadframe strip 15 with the sprocket teeth 42, the aluminum foil tape 17 is placed over the main leadframe strip 15 and threaded through the sprocket wheel 52 and 54 and hold down roller 18 configurations until the front end of the aluminum foil 17 protrudes past sprocket wheels 54 and the sprocket holes 36 on the aluminum tape 17 are engaged with sprocket teeth 51 on sprocket wheels 52 and 54.

Alignment of the micro leadframes 16 with the semiconductor die contact pads and leads of the main leadframe is now performed utilizing the optical system 30. To perform such an alignment, movement of the aluminum tape 17 relative to the main leadframe strip 15 must be accomplished. To accomplish this, one of the drive wheels 63 and 65 and preferrably the drive wheel 65 associated with sprocket belt 61, and which therefore causes the main leadframe sprocket wheel 40 to rotate, is made to be disengageable from the axle 79. This may be accomplished by providing drive wheel 65 with a collar having a radially projecting screw 83 penetrating therethrough. The screw 83 may be tightened to engage axle 79 or loosened for disengagement of drive wheel 65 from axle 79. Thus, alignment of the micro leadframes 16 and main leadframes 14 is accomplished by disengaging the drive wheel 65 which drives the main leadframe strip 15 and manually adjusting the main leadframe strip 15 while observing through the optical device 30 until suitable alignment is achieved. After alignment is achieved, the main leadframe drive wheel 65 is engaged with axle 79 by the tightening of screw 83.

It is to be realized that if the micro leadframes and their associated sprocket holes have been properly placed upon the aluminum tape 17, such as can be accomplished by the process and machine described in the patent application entitled "Improved Aluminum Micro Leadframe Tape and a Process and a Machine for the Manufacture Thereof," filed on the same day as the instant application, and if the main leadframes 14 are accurately formed in the main leadframe strip 15, that the alignment of the micro leadframes and main leadframes will remain constant and accurate during the operation of the instant device.

Having aligned the main leadframes 14 and micro leadframes 16 relative to each other and tightened screw 83, drive handle 49 can be rotated to cause both the aluminum foil 17 and the main leadframe strip 15 to move at the same rate until they are properly positioned for bonding beneath the bonding plate 60. The sprocket holes 36, formed in the aluminum tape 17 are configured to aid in this bonding alignment determination. Specifically, the sprocket holes 36 are formed such that one of them, relative to each micro leadframe pattern 16, is accurately aligned with the mid-point of the micro leadframe pattern 16 and specially marked for identification. Such a micro leadframe alignment hole 104 could take the form of a second hole placed slightly towards the center of the aluminum foil 17 from the mid-point sprocket hole. A pointer 100 is engaged to the outer surface of the heating block 26 such that its lower pointed end 102 is suspended precisely above the micro leadframe alignment hole 104, when the micro leadframe is properly positioned beneath the bonding head 26. Thus, when the micro leadframe alignment hole 104 is precisely beneath the pointer end 102, the thermo compression bonder is lowered and the micro leadframe is bonded to the semiconductor die contact pads and main leadframe leads as described hereinabove.

After a thermo compression bond has been made, the thermo compression bonder 22 is raised and the drive handle 49 is rotated to simultaneously move both the main leadframe strip 15 and aluminum foil 17 until a second micro leadframe alignment hole 104 is located beneath the pointer end 102, whereupon the thermo compression bonder is lowered and the bonding of a second micro leadframe to its associated semiconductor die and main leadframe occurs. It will be appreciated that by repeating the simple process of turning the drive handle 49 and checking the micro leadframe alignment hole 104 with the pointer end 102, that the electrical connection of semiconductor die to main leadframes utilizing aluminum tape micro leadframes can be accomplished in a rapid, efficient and accurate manner.

After the micro leadframes have passed under the thermo compression bonder, it is necessary to remove the aluminum foil surrounding the leads of the micro leadframe 16, such that only the leads 90 of the micro leadframe remain attached to the semiconductor die 64 and main leadframe 14. To accomplish this, the micro leadframes 16 are formed in the aluminum foil 17 such that they will easily tear at the point of contact of the outer ends of each lead of the micro leadframe with the remainder of the aluminum foil. Thus, the aluminum foil is simply separated from the main leadframe strip 15 and upon doing so the micro leadframes remain bonded to the leads of the main leadframe.

As noted hereinabove, a small aluminum square 87 is located in the center of the micro leadframe pattern 16 to maintain the inner ends 71 of the leads 90 of the micro leadframe 16 in their proper orientation. When the aluminum foil 17 is pulled away from the main leadframe strip 15 the small square 87 typically remains attached to the inner ends 71 of the micro leadframe leads 90. A small vacuum device is then utilized to pick off the small aluminum square 87 from the center of the semiconductor die. The points of joinder of the inner ends 71 of the leads of the micro leadframe to the small square are formed to be sufficiently narrow that the aluminum square will break off without damaging the thermo compression bonds of the micro leadframe leads 90 with the semiconductor die contact pads 92.

Whereas, the preferred embodiment of the present invention has been described above, it is contemplated that other alterations and modifications may become apparent to those skilled in the art after having read the above disclosure. It is therefore intended that the appended claims be interpreted as covering all such alterations and modifications as fall within the true spirit and scope of the invention.

What is claimed is:

1. An improved semiconductor die bonding machine for electrically connecting the contact pads of a semiconductor die to the leads of a die holding member utilizing a suitable micro leadframe comprising:
    a bonding surface heated to a temperature of approximately 450° C.;
    means for positioning a die holding member proximate said bonding surface, said die holding member having a central area formed therein to which a semiconductor die is affixed such that the contact pads thereof face away from said central area and are generally aligned relative to the leads of said die holding member;
    means for positioning a micro leadframe, which is one of a series of micro leadframes that are serially formed in an aluminum foil, proximate said bonding surface, such that said micro leadframe is positioned between said bonding surface and said die holding member;
    means for the alignment of said micro leadframe relative to said die holding member and semiconductor die such that each lead of said micro leadframe is juxtaposed immediately above the semiconductor die contact pad and die holding member lead to which it is to be bonded;
    means for causing the simultaneous movement of said aluminum foil and said die holding member such that said aluminum foil and said die holding member are caused to move in alignment beneath said bonding surface;
    means for the alignment of said micro leadframe beneath said bonding surface; and
    means for causing a pressing contact against said bonding surface of each lead of said micro leadframe with a semiconductor die contact pad and a die holding member lead, such that each said micro leadframe lead is bonded at one end to a contact pad and at the other end to a die holding member lead.

2. The improved semiconductor die bonding machine as recited in claim 1 wherein portions of said bonding surface are recessed relative to other portions, whereby the simultaneous bonding of both ends of the leads of a micro leadframe is accomplished.

3. The improved semiconductor die bonding machine as recited in claim 1 wherein said means for the alignment of said micro leadframe beneath said bonding surface includes a pointer affixed to said bonding surface and an alignment hole formed in said aluminum foil, said pointer being formed to point at said hole when said leadframe is aligned beneath said bonding surface.

4. The improved semiconductor die bonding machine as recited in claim 1 wherein said die holding member is formed as a strip of main leadframes, each of which has a semiconductor die bonded to the central platform thereof, and said means for causing the simultaneous movement of said main leadframe strip and aluminum foil includes sprocket holes which are formed in said main leadframe and said aluminum strip and at least one rotatable sprocket wheel having sprocket teeth which interact with said sprocket holes.

5. The improved semiconductor die bonding machine as recited in claim 4 wherein separate sprocket wheels are provided for the movement of said aluminum foil and said main leadframe strip; and
    a means is provided for causing the simultaneous rotation of said sprocket wheels.

6. The improved semiconductor die bonding machine as recited in claim 5 wherein said means for causing the simultaneous rotation of said sprocket wheels includes two sprocket drive wheels of equal circumference which are mounted on a single axle;
    a sprocket belt being joined to one of said two sprocket drive wheels, said sprocket belt also being joined to said sprocket wheels which cause the movement of said aluminum foil;
    a second sprocket belt being joined to the other of said two sprocket drive wheels, said sprocket belt being engaged to said sprocket wheel which causes the movement of said main leadframe strip.

7. The improved semiconductor die bonding machine as recited in claim 6 wherein a hold down mechanism is provided to hold said aluminum foil down such that said sprocket holes formed therein will properly engage said sprocket teeth formed in said sprocket wheel which causes the movement of said aluminum foil.

8. An improved semiconductor die bonding machine for electrically connecting the contact pads of a semiconductor die to the leads of a die holding member utilizing a suitable micro leadframe comprising:
    a bonding surface heated to a temperature of approximately 450° C.;

means for positioning a die holding member proximate said bonding surface, said die holding member having a central area formed therein to which a semiconductor die is affixed such that the contact pads thereof face away from said central area and are generally aligned relative to the leads of said die holding member;

means for positioning a micro leadframe, which is one of a series of micro leadframes that ate serially formed in an aluminum foil, proximate said bonding surface, such that said micro leadframe is positioned between said bonding surface and said die holding member;

means for the alignment of said micro leadframe relative to said die holding member and semiconductor die such that each lead of said micro leadframe is juxtaposed immediately above the semiconductor die contact pad and die holding member lead to which it is to be bonded;

means for causing the simultaneous movement of said aluminum foil and said die holding member such that said aluminum foil and said die holding member are caused to move in alignment beneath said bonding surface;

means for the alignment of said micro leadframe beneath said bonding surface; and means for causing a pressing contact against said bonding surface of each lead of said micro leadframe with a semiconductor die contact pad and a die holding member lead such that each said micro leadframe lead is bonded at one end to a contact pad and at the other end to a die holding member;

said die holding member being formed as a strip of main leadframes, each of which has a semiconductor die bonded to the central platform thereof;

said means for causing the simultaneous movement of said main leadframe strip and aluminum foil including sprocket holes which are formed in said main leadframe and said aluminum strip and two sprocket drive wheels of equal circumference which are mounted on a single axle;

a sprocket belt being joined to one of said two sprocket drive wheels, said sprocket belt also being joined to sprocket wheels which cause the movement of said aluminum foil;

a second sprocket belt being joined to the other of said two sprocket drive wheels, said sprocket belt being engaged to sprocket wheels which cause the movement of said main leadframe strip.

9. The improved semiconductor die bonding machine as recited in claim 8 wherein a hold down mechanism is provided to hold said aluminum foil down such that said sprocket holes formed therein will properly engage said sprocket teeth formed in said sprocket wheel which causes the movement of said aluminum foil.

* * * * *